(12) United States Patent
Liu (10) Patent No.: US 9,583,581 B1
(45) Date of Patent: Feb. 28, 2017

(54) DISCONTINUITIES IN A SEMICONDUCTOR DEVICE TO ACCOMMODATE FOR MANUFACTURING VARIATIONS AND/OR MISALIGNMENT TOLERANCES

(71) Applicant: Broadcom Corporation, Irvine, CA (US)

(72) Inventor: Qing Liu, Watervliet, NY (US)

(73) Assignee: Broadcom Corporation, Irvine, CA (US)

( * ) Notice: Subject to any disclaimer, the term of this patent is extended or adjusted under 35 U.S.C. 154(b) by 0 days.

(21) Appl. No.: 14/928,222

(22) Filed: Oct. 30, 2015

Related U.S. Application Data (60) Provisional application No. 62/246,957, filed on Oct. 27, 2015.

(51) Int. Cl.
*H01L 29/41* (2006.01)
*H01L 29/06* (2006.01)
*H01L 29/08* (2006.01)
*H01L 29/417* (2006.01)
*H01L 27/088* (2006.01)

(52) U.S. Cl.
CPC ....... *H01L 29/41783* (2013.01); *H01L 27/088* (2013.01); *H01L 29/0649* (2013.01)

(58) Field of Classification Search
CPC .......... H01L 29/41783; H01L 29/0649; H01L 27/088
See application file for complete search history.

(56) References Cited

U.S. PATENT DOCUMENTS

| 5,736,446 | A  | * | 4/1998  | Wu    | H01L 21/2254  |
|           |    |   |         |       | 257/E21.148   |
| 5,972,763 | A  | * | 10/1999 | Chou  | H01L 29/4983  |
|           |    |   |         |       | 257/E29.152   |
| 6,633,070 | B2 | * | 10/2003 | Miura | H01L 21/28114 |
|           |    |   |         |       | 257/377       |

(Continued)

OTHER PUBLICATIONS

Park, J., "Improving CMOS Speed and Switching Power with Air-gap Structures," Electrical Engineering and Computer Sciences, University of California at Berkeley, Technical Report No, UCB/EECS-2011-84, Jul. 21, 2011; 119 pages.

*Primary Examiner* — Ida M Soward
(74) *Attorney, Agent, or Firm* — Sterne, Kessler, Goldstein & Fox P.L.L.C.

(57) ABSTRACT

An integrated circuit is described as having one or more contact regions to provide one or more interconnections between one or more transistors of the integrated circuit and another integrated circuit. The one or more contact regions represent a self-aligned contact (SAC) whose positioning is determined through one or more patterning processes of a semiconductor fabrication process. The one or more contact regions include one or more contact discontinuities to allow the integrated circuit to accommodate for a wide range of the manufacturing variations and/or the misalignment tolerances by preventing the one or more contact regions from physically contacting other regions, such as gate regions to provide an example, of the one or more transistors. As such, the one or more contact discontinuities have a dynamic size, such as a dynamic area to provide an example, which is dependent upon the manufacturing variations and/or the misalignment tolerances.

20 Claims, 6 Drawing Sheets

(56) References Cited

U.S. PATENT DOCUMENTS

| | | | | |
|---|---|---|---|---|
| 7,419,898 B2 * | 9/2008 | Liaw | ................. | H01L 21/76897 |
| | | | | 257/E21.168 |
| 8,288,296 B2 * | 10/2012 | Wong | ................ | H01L 21/28123 |
| | | | | 257/310 |
| 8,362,542 B2 * | 1/2013 | Kang | .................... | H01L 21/764 |
| | | | | 257/315 |
| 8,952,452 B2 * | 2/2015 | Kang | ....................... | H01L 29/78 |
| | | | | 257/346 |
| 2010/0327367 A1 * | 12/2010 | Richter | ............. | H01L 21/76816 |
| | | | | 257/369 |
| 2012/0302014 A1 * | 11/2012 | Huang | ................ | H01L 29/0673 |
| | | | | 438/164 |
| 2015/0091089 A1 * | 4/2015 | Niebojewski | ....... | H01L 29/0843 |
| | | | | 257/347 |
| 2015/0243544 A1 * | 8/2015 | Alptekin | ............. | H01L 21/7682 |
| | | | | 438/586 |
| 2015/0263122 A1 * | 9/2015 | Hsiao | .................... | H01L 29/515 |
| | | | | 257/401 |
| 2015/0372102 A1 * | 12/2015 | Usami | ............... | H01L 29/41775 |
| | | | | 257/327 |
| 2016/0204262 A1 * | 7/2016 | Seo | ....................... | H01L 27/088 |
| | | | | 257/401 |
| 2016/0276273 A1 * | 9/2016 | Kwon | ................. | H01L 23/5283 |

* cited by examiner

DISCONTINUITIES IN A SEMICONDUCTOR DEVICE TO ACCOMMODATE FOR MANUFACTURING VARIATIONS AND/OR MISALIGNMENT TOLERANCES

CROSS-REFERENCE TO RELATED APPLICATIONS

The present application claims the benefit of U.S. Provisional Patent Appl. No. 62/246,957, filed Oct. 27, 2015, which is incorporated herein by reference in its entirety.

BACKGROUND

Field of Disclosure

The present disclosure relates generally to a semiconductor device having air-gap spacer regions, and including a contact region having one or more discontinuities to accommodate for manufacturing variations and/or misalignment tolerances present within a semiconductor fabrication process.

Related Art

The continued improvement of semiconductor fabrication processes has allowed manufacturers and designers to create a smaller and a more powerful electronic device. The semiconductor fabrication process has progressed from a 10 μm semiconductor fabrication process that was reached around 1971 to a 22 nm semiconductor fabrication process that was reached around 2012. The semiconductor fabrication process is expected to further progress onto a 5 nm semiconductor fabrication process around 2019. With each progression of the semiconductor fabrication process, components of the integrated circuits have become smaller to allow more components to be fabricated onto the semiconductor substrate. However, with each progression of the semiconductor fabrication process, new challenges in creating integrated circuits have been uncovered.

The manufacturers and designers are presently manufacturing and designing integrated circuits with self-aligned components, such as self-aligned gates (SAG) and self-aligned contacts (SAC) to provide some examples. The positioning of these self-aligned components is determined through patterning of various dielectric regions within the integrated circuits. However, one challenge in creating self-aligned components with each progression of the semiconductor fabrication process relates to manufacturing variations and/or misalignment tolerances present within the semiconductor fabrication process. These manufacturing variations and/or misalignment tolerances can cause these self-aligned components to be displaced from their intended position in the integrated circuits which can lead to catastrophic failure of the integrated circuits.

BRIEF DESCRIPTION OF THE DRAWINGS/FIGURES

Embodiments of the disclosure are described with reference to the accompanying drawings. In the drawings, like reference numbers indicate identical or functionally similar elements. Additionally, the left most digit(s) of a reference number identifies the drawing in which the reference number first appears. In the accompanying drawings.

The disclosure will now be described with reference to the accompanying drawings. In the drawings, like reference numbers generally indicate identical, functionally similar, and/or structurally similar elements. The drawing in which an element first appears is indicated by the leftmost digit(s) in the reference number.

DETAILED DESCRIPTION OF THE DISCLOSURE

Overview

The present disclosure describes an integrated circuit having one or more contact regions. The one or more contact regions provide one or more interconnections between one or more transistors of the integrated circuit and another semiconductor component of the integrated circuit and/or another semiconductor component of another integrated circuit. The one or more contact regions represent self-aligned contacts (SACs) whose positioning is determined through one or more patterning processes of a semiconductor fabrication process. The one or more contact regions include one or more contact discontinuities to accommodate for manufacturing variations and/or misalignment tolerances present within the semiconductor fabrication process. The one or more contact discontinuities allow the integrated circuit to accommodate for a wide range of the manufacturing variations and/or the misalignment tolerances by preventing the one or more contact regions from physically contacting other regions, such as gate regions to provide an example, of the one or more transistors. As such, the one or more contact discontinuities have a dynamic size, such as a dynamic area to provide an example, which is dependent upon the manufacturing variations and/or the misalignment tolerances. As the manufacturing variations and/or the misalignment tolerances cause the one or more contact regions to be positioned further from their intended positioning, the size of the one or more contact discontinuities increase. Similarly, as the manufacturing variations and/or the misalignment tolerances cause the one or more contact regions to be positioned close to their intended positioning, the size of the one or more contact discontinuities decrease.

Exemplary Integrated Circuit

Figure 1:
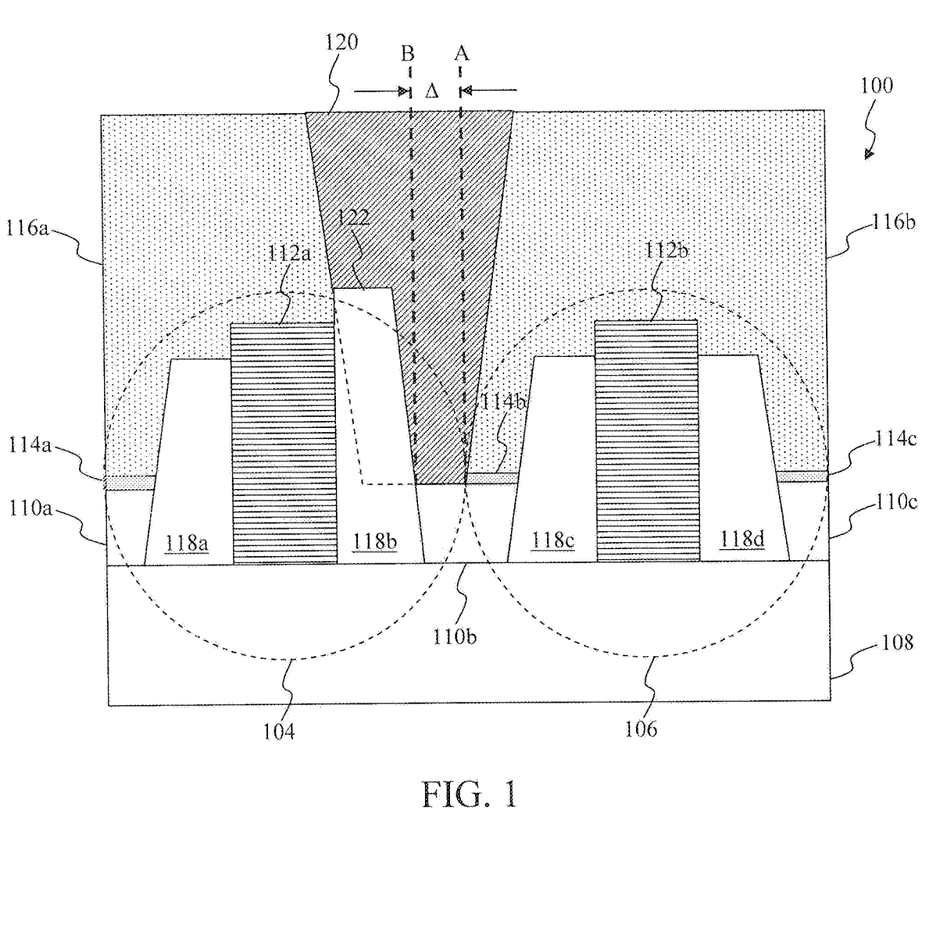
FIG. 1 illustrates an integrated circuit according to an exemplary embodiment of the present disclosure.

FIG. 1 illustrates an integrated circuit according to an exemplary embodiment of the present disclosure. As illustrated in FIG. 1, an integrated circuit 100 includes a first transistor 104 and a second transistor 106 situated on and/or within a semiconductor substrate 108 of a first conductivity type. The semiconductor substrate 108 represents a physical material on which the first transistor 104 and the second transistor 106 is situated on and/or within. For example, the first transistor 104 and the second transistor 106 are situated on the semiconductor substrate 108 that is composed of a p-type material. The p-type material include impurity atoms of an acceptor type, such as, but not limited to, boron (B) or aluminum (Al) to provide some examples, that are capable of accepting electrons. As another example, the first transistor 104 and the second transistor 106 are situated on the semiconductor substrate 108 that is composed of an n-type material. The n-type material include impurity atoms of a donor type, such as phosphorus (P), arsenic (As), or antimony (Sb) to provide some examples, that are capable of donating electrons. Although the first transistor 104 and the second transistor 106 are illustrated as being two-dimensional planar transistors, those skilled in the relevant art(s) will recognize that the first transistor 104 and the second transistor 106 can be three-dimensional non-planar transistors, such as FinFETs to provide an example, on and/or within the semiconductor substrate 108 without departing from the spirit and scope of the present disclosure.

The first transistor 104 and the second transistor 106 include source/drain regions 110a, 110b, and 110c (herein referred to as source/drain regions 110) and gate regions 112a and 112b (herein referred to as gate regions 112). Herein, "source/drain" means a source region or a drain region, as they are interchangeable depending on configuration of the first transistor 104 and the second transistor 106. As illustrated in FIG. 1, the source/drain regions 110 represent raised source/drain regions of the first transistor 104 and the second transistor 106 that are situated on the semiconductor substrate 108; however, those skilled in the relevant art(s) will recognize that the source/drain regions 110 can be situated within the semiconductor substrate 108 without departing from the spirit and scope of the present disclosure. The source/drain regions 110 are of a second conductivity type that is different from the first conductivity type. In an exemplary embodiment, the source/drain regions 110 are generally heavily doped with the n-type material when the semiconductor substrate 108 is of the p-type material and/or one or more intrinsic materials and/or with the p-type material when the semiconductor substrate 108 is of the n-type material, the p-type material, and/or the one or more intrinsic materials.

The gate regions 112 are situated on the semiconductor substrate 108. In an exemplary embodiment, the gate regions 112 represent high dielectric constant (high-κ)/metal-gate (HK/MG) regions of the first transistor 104 and the second transistor 106. These HK/MG regions include one or more high-κ dielectric materials situated on the semiconductor substrate 108 and one or more conductive regions situated on the one or more high-κ dielectric materials. The one or more high-κ materials include aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), or any other suitable material having a dielectric constant greater than a dielectric constant of silicon dioxide ($SiO_2$) that will be apparent to those of ordinary skill in the relevant art(s) without departing from the spirit and scope of the present disclosure. The one or more conductive regions include one or more conductive materials such as aluminum (Al), Ai and silicon (Si) (Al—Si) alloy, titanium disilicide ($TiSi_2$), titanium nitride (TiN), tungsten (W), molybdenum disilicide ($MoSi_2$), platinum silicide (PtSi), cobalt disilicide ($CoSi_2$), tungsten silicide (WSi), and/or any other suitable material that will be apparent to those skilled in the relevant art(s) without departing from the spirit and scope of the present disclosure.

The integrated circuit 100 includes first dielectric regions 114a through 114c (herein referred to as first dielectric regions 114) situated on the source/drain regions 110 and second dielectric regions 116a and 116b (herein referred to as second dielectric regions 116) situated on the first dielectric regions 114. The first dielectric regions 114 include the one or more high-κ dielectric materials. In an exemplary embodiment, the first dielectric regions 114 implement an etch stop region in the integrated circuit 100 to protect the source/drain regions 110a and 110c during fabrication of the integrated circuit 100. The second dielectric regions 116 include one or more low-κ dielectric materials and/or the one or more high-κ materials. The one or more low-κ dielectric materials include silicon dioxide ($SiO_2$) or any other suitable material having a dielectric constant less than or equal to the dielectric constant of silicon dioxide ($SiO_2$) that will be apparent to those of ordinary skill in the relevant art(s) without departing from the spirit and scope of the present disclosure. In an exemplary embodiment, the second dielectric regions 116 include a first dielectric material situated on the first dielectric regions 114 to provide an interlayer dielectric of the integrated circuit 100 and a second dielectric material situated on the first dielectric material to provide a passivation layer of the integrated circuit 100. In this exemplary embodiment, the first dielectric material includes the one or more high-κ materials and the second dielectric material includes the one or more low-κ materials.

The integrated circuit 100 additionally includes air-gap spacer regions 118a through 118d (herein referred to as air-gap spacer regions 118) situated on the semiconductor substrate 108. The air-gap spacer regions 118 represent regions in the integrated circuit 100 that are free of solid material; however, the air-gap spacer regions 118 include a liquid and/or a gas such as air to provide an example. Although the air-gap spacer regions 118 are illustrated as being trapezoidal in FIG. 1, this is for illustrative purposes only. Those skilled in the relevant art(s) will recognize that the air-gap spacer regions 118 can be implemented using regular or irregular polygons that are constructed of linear segments, closed curves that are constructed of non-linear segments, or any other geometric shape that can be constructed using any suitable combination of linear and non-linear segments that will be apparent to those skilled in the relevant art(s) without departing from the spirit and scope of the present disclosure.

The integrated circuit 100 further includes a contact region 120 to provide an interconnection between the first transistor 104 and the second transistor 106 and other semiconductor components formed on and/or within the semiconductor substrate 108 and/or other semiconductor components formed on and/or within other semiconductor substrates. The contact region 120 includes the one or more conductive materials and overlaps the air-gap spacer region 118b in the horizontal direction. Although the contact region 120 is illustrated as being trapezoidal in FIG. 1, this is for illustrative purposes only. Those skilled in the relevant art(s) will recognize that the contact region 120 can be implemented using any regular or irregular polygon that is constructed of linear segments, a closed curve that is constructed of non-linear segments, or any other geometric shape that can be constructed using any suitable combination of linear and non-linear segments that will be apparent to those skilled in the relevant art(s) without departing from the spirit and scope of the present disclosure. Although the contact region 120 is illustrated as being trapezoidal in FIG. 1, this is for illustrative purposes only. Those skilled in the relevant art(s) will recognize that the contact region 120 can be implemented using any regular or irregular polygon that is constructed of linear segments, a closed curve that is constructed of non-linear segments, or any other geometric shape that can be constructed using any suitable combination of linear and non-linear segments that will be apparent to those skilled in the relevant art(s) without departing from the spirit and scope of the present disclosure. In an exemplary embodiment, the contact region 120 can be implemented as a non-rectifying contact region, such as an ohmic contact to provide an example.

Manufacturing Variations and/or Misalignment Tolerances within the Semiconductor Fabrication Process Typically, the first transistor 104, the second transistor 106, the first dielectric regions 114, the second dielectric regions 116, the air-gap spacer regions 118, and the contact region 120 are manufactured or fabricated on or within the semiconductor substrate 108 using a semiconductor fabrication process to form the integrated circuit 100. The semiconductor fabrication process represents a multiple-step sequence of photolithographic and chemical processing steps to form the integrated circuit 100. In an exemplary embodiment, the contact region 120 represents a self-aligned contact (SAC) whose positioning is determined through a patterning of the first dielectric regions 114 and/or the second dielectric regions 116. Preferably, the contact region 120 should be centered equidistant from the gate regions 112 in the horizontal direction along the line A as illustrated in FIG. 1. The line A represents an intended position for the contact region 120 which, in an exemplary embodiment, is an appreciate center of the source/drain region 110b.

However, in practice, manufacturing variations and/or misalignment tolerances present within the semiconductor fabrication process can cause the contact region 120 to be centered in the horizontal direction along the line B as illustrated in FIG. 1. The line B is offset from the line A by a displacement distance $\Delta$ in the horizontal direction. As illustrated in FIG. 1, The contact region 120 includes a contact discontinuity 122 that is caused by the air-gap spacer region 118b extending into the contact region 120. Although the contact discontinuity 122 is illustrated as being a parallelogram in FIG. 1, this is for illustrative purposes only. Those skilled in the relevant art(s) will recognize that the contact discontinuity 122 is dependent upon the shape of the air-gap spacer region 118b which can be implemented using any regular or irregular polygon that is constructed of linear segments, a closed curve that is constructed of non-linear segments, or any other geometric shape that can be constructed using any suitable combination of linear and non-linear segments that will be apparent to those skilled in the relevant art(s) without departing from the spirit and scope of the present disclosure.

The contact discontinuity 122 allows the integrated circuit 100 to accommodate for a wide range of displacement distances $\Delta$. As illustrated in FIG. 1, the air-gap spacer region 118b extends beyond the gate region 112a in the vertical direction. The contact discontinuity 122 is characterized as having a dynamic size, such as a dynamic area to provide an example, which is dependent upon the displacement distance $\Delta$. As the manufacturing variations and/or the misalignment tolerances cause the line B to be further from the line A, namely a larger displacement distance $\Delta$, the size of the contact discontinuity 122 increases. Similarly, as the manufacturing variations and/or the misalignment tolerances cause the line B to be closer to the line A, namely a smaller displacement distance $\Delta$, the size of the contact discontinuity 122 decreases. In some situations, the displacement distance $\Delta$ can be sufficiently large such that the contact region 120 overlaps the gate region 112a. In these situations, the contact discontinuity 122 sufficiently prevents the contact region 120 from physically contacting the gate region 112a. Additionally, the contact discontinuity 122 sufficiently prevents the contact region 120 from impeding into the air-gap spacer region 118b. This causes a parasitic capacitance between the gate region 112a and the contact region 120 to remain small since the capacitance is related to a distance between the gate region 112a and the contact region 120. If the contact region 120 were allowed to impede into the air-gap spacer region 118b, the distance between the gate region 112a and the contact region 120 would be greatly reduced causing the parasitic capacitance between the gate region 112a and the contact region 120 to be larger.

Exemplary Method of Fabrication of the Exemplary Integrated Circuit

FIGS. 2A through 2I illustrate an exemplary method of fabrication of the integrated circuit according to an exemplary embodiment of the present disclosure. The exemplary method of fabrication represents a multiple-step sequence of photolithographic and chemical processing steps to form an integrated circuit, such as the integrated circuit 100 to provide an example, having a contact region with one or more discontinuities. The multiple-step sequence of photolithographic and chemical processing steps include deposition, removal, and/or patterning processes to provide some examples. The deposition process represents a processing step of the exemplary method of fabrication where material is grown, coated, or otherwise transferred. The removal process represents another processing step of the exemplary method of fabrication where material is removed. The patterning process represents a further processing step of the exemplary method of fabrication where material is shaped or altered. Those skilled in the relevant art(s) will recognize that the photolithographic and chemical processing steps not be performed in the order as described in FIG. 2A through 2J without departing from the spirit and scope of the present disclosure. Additionally, those skilled in the relevant art(s) will recognize that two or more of these photolithographic and chemical processing steps of the exemplary method of fabrication as described in FIG. 2A through 2J can be performed simultaneously, or substantially simultaneously, without departing from the spirit and scope of the present disclosure.

Further, the exemplary method of fabrication selects from among one or more low-κ dielectric materials, one or more high-κ materials, and/or one or more conductive materials in forming the integrated circuit. The one or more low-κ dielectric materials include silicon dioxide ($SiO_2$) or any other suitable material having a dielectric constant less than or equal to the dielectric constant of silicon dioxide ($SiO_2$) that will be apparent to those of ordinary skill in the relevant art(s) without departing from the spirit and scope of the present disclosure. The one or more high-κ materials include aluminum oxide ($Al_2O_3$), hafnium dioxide ($HfO_2$), hafnium silicate ($HfSiO_4$), lanthanum oxide ($La_2O_3$), silicon nitride (SiN), strontium oxide (SrO), titanium dioxide ($TiO_2$), tantalum pentoxide ($Ta_2O_5$), yttrium oxide ($Y_2O_3$), zirconium dioxide ($ZrO_2$), zirconium silicate ($ZrSiO_4$), or any other suitable material having a dielectric constant greater than a dielectric constant of silicon dioxide ($SiO_2$) that will be apparent to those of ordinary skill in the relevant art(s) without departing from the spirit and scope of the present disclosure. The one or more conductive materials include aluminum (Al), Ai and silicon (Si) (Al—Si) alloy, titanium disilicide ($TiSi_2$), titanium nitride (TiN), tungsten (W), molybdenum disilicide ($MoSi_2$), platinum silicide (PtSi), cobalt disilicide ($CoSi_2$), tungsten silicide (WSi), and/or any other suitable material that will be apparent to those skilled in the relevant art(s) without departing from the spirit and scope of the present disclosure.

Figure 2A:
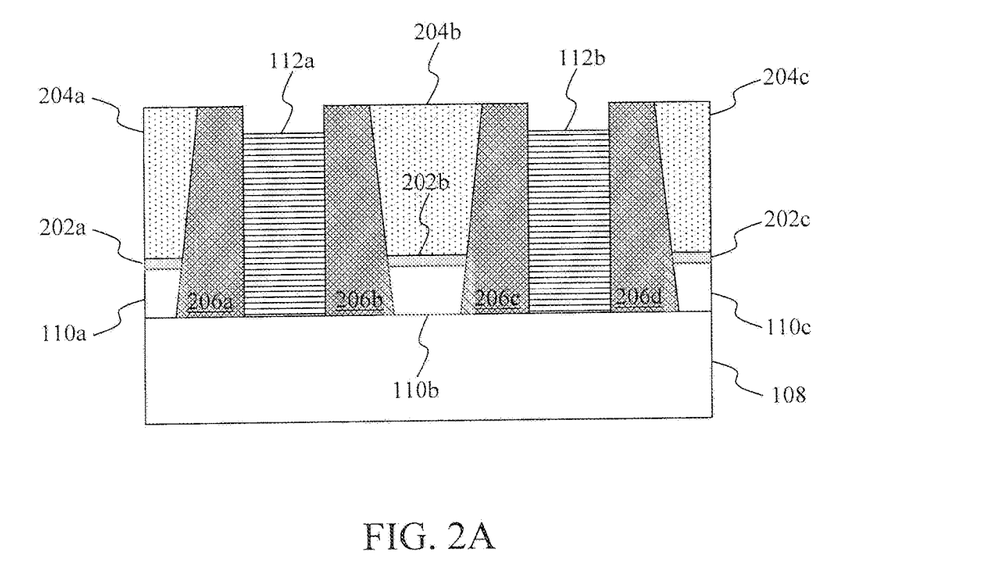
FIGS. 2A through 2I illustrate an exemplary method of fabrication of the integrated circuit according to an exemplary embodiment of the present disclosure.

As illustrated in FIG. 2A, the exemplary method of fabrication forms the source/drain regions 110, the gate regions 112, first dielectric regions 202a through 202c, second dielectric regions 204a through 204c, and sacrificial dielectric spacer regions 206a through 206d on the semiconductor substrate 108. The exemplary method of fabrication performs a first deposition process to form the source/drain regions 110 on the semiconductor substrate 108. As illustrated in FIG. 2A, the source/drain regions 110 represent raised source/drain regions that are formed on the semiconductor substrate 108. Next, the exemplary method of fabrication performs a second deposition process to form the first dielectric regions 202a through 202c (herein referred to as first dielectric regions 202) on the source/drain regions 110 followed by a third deposition process to form the second dielectric regions 204a through 204c (herein referred to as second dielectric regions 204) on the first dielectric regions 202. The second deposition process forms the first dielectric regions 202 by growing and/or transferring the one or more high-κ dielectric materials on the source/drain regions 110. Next, the third deposition process forms the second dielectric regions 204 by growing and/or transferring the one or more low-κ dielectric materials and/or the one or more high-κ materials on the first dielectric regions 202.

Thereafter, the exemplary method of fabrication performs a first patterning process and a fourth deposition process to form the gate regions 112 and the sacrificial dielectric spacer regions 206a through 206d (herein referred to as sacrificial dielectric spacer regions 206) within the first dielectric regions 202 and the second dielectric regions 204. The first patterning process patterns the first dielectric regions 202 and the second dielectric regions 204. Next, the fourth deposition process grows and/or transfers the one or more high-κ dielectric materials and the one or more conductive materials to form the gate regions 112, and the one or more high-κ dielectric materials to form the sacrificial dielectric spacer regions 206.

Figure 2B:
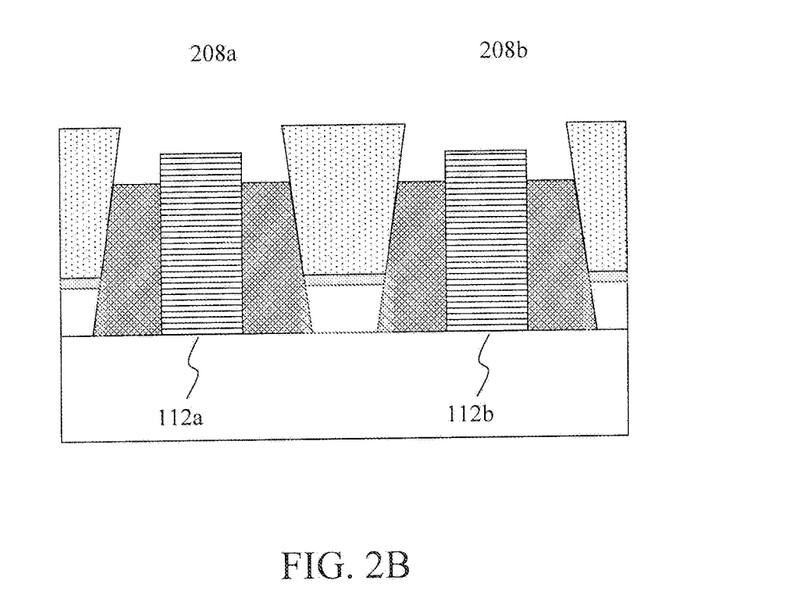

As illustrated in FIG. 2B, the exemplary method of fabrication performs a second patterning process on the sacrificial dielectric spacer regions 206 to form apertures 208a through 208b (herein referred to as apertures 208) within the sacrificial dielectric spacer regions 206. The second patterning process includes an etching process, such as a dry etch or a wet etch to provide some examples, to remove some of the sacrificial dielectric spacer regions 206 to form the apertures 208.

Figure 2C:
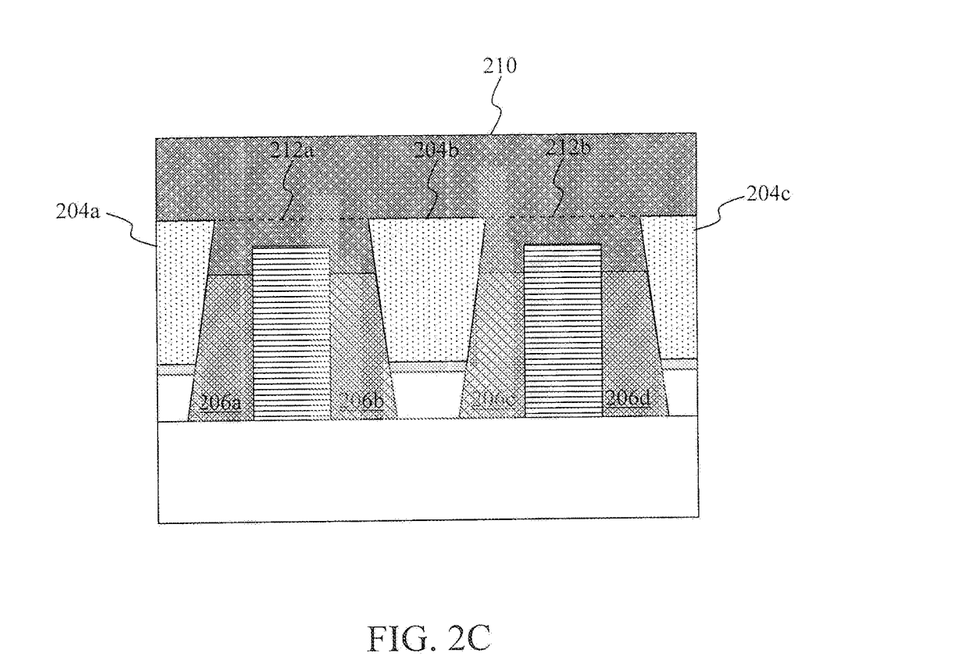

As illustrated in FIG. 2C, the exemplary method of fabrication performs a fifth deposition process to grow and/or transfer the one or more high-κ dielectric materials on the second dielectric regions 204 and the sacrificial dielectric spacer regions 206 to form a high-κ sacrificial capping layer 210 and high-κ sacrificial capping regions 212a and 212b (herein referred to as high-κ sacrificial capping regions 212).

Figure 2D:
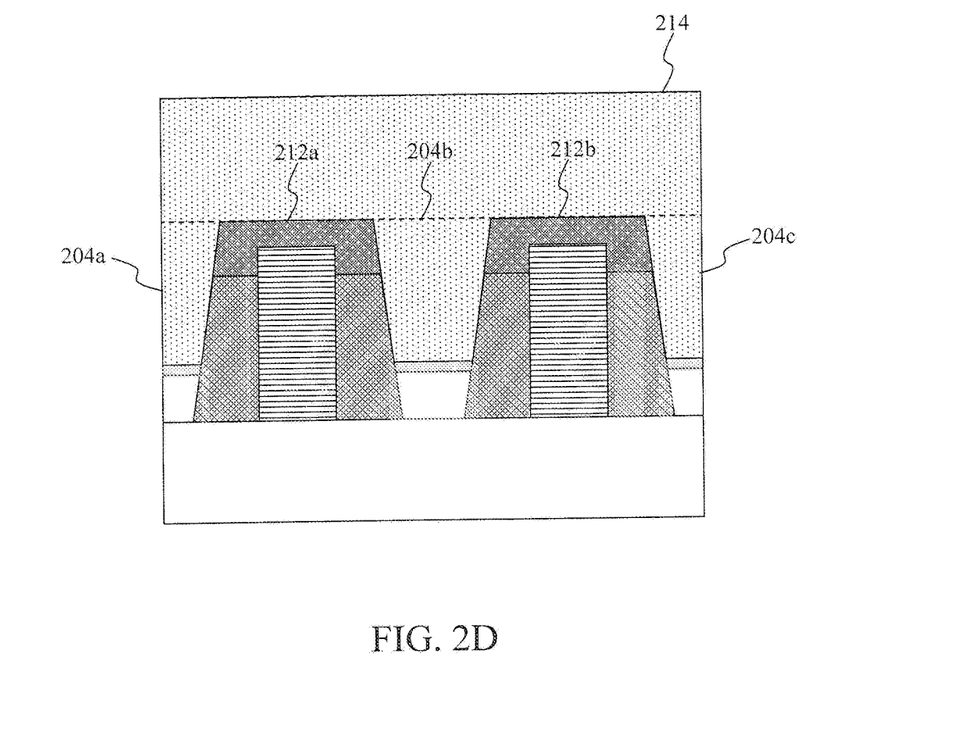

As illustrated in FIG. 2D, the exemplary method of fabrication performs a first removal process, such as a Chemical Mechanical Polishing/Planarization (CMP) process to provide an example, to remove the high-κ sacrificial capping layer 210. In an exemplary embodiment, this removal process essentially smooths surfaces of the second dielectric regions 204 and of the high-κ sacrificial capping regions 212 in the horizontal direction. Thereafter, the exemplary method of fabrication performs a sixth deposition process to grow and/or transfer the one or more low-κ dielectric materials on the second dielectric regions 204 to form a low-κ sacrificial capping layer 214.

Figure 2E:
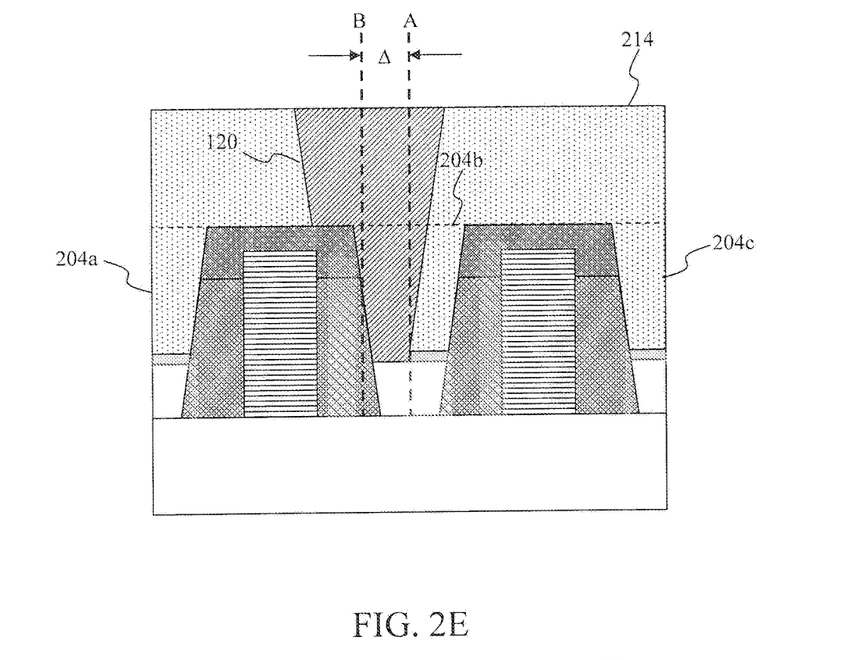

As illustrated in FIG. 2E, the exemplary method of fabrication performs a third patterning process on the second dielectric region 204b and the low-κ sacrificial capping layer 214. The third patterning process includes an etching process, such as a dry etch or a wet etch to provide some examples, to remove some of the second dielectric region 204b and the low-κ sacrificial capping layer 214. Thereafter, the exemplary method of fabrication performs a seventh deposition process to transfer the one or more conductive materials within regions of the second dielectric region 204b and the low-κ sacrificial capping layer 214 to form the contact region 120 that have been etched. As additionally illustrated in FIG. 2E, manufacturing variations and/or misalignment tolerances present within the third patterning process cause the contact region 120 to be positioned in the horizontal direction along the line B as illustrated in FIG. 2E. The line B is offset from the line A by the displacement distance $\Delta$ in the horizontal direction. In an exemplary embodiment, the contact region 120 represents a self-aligned contact (SAC) whose positioning is determined by the third patterning process.

Figure 2F:
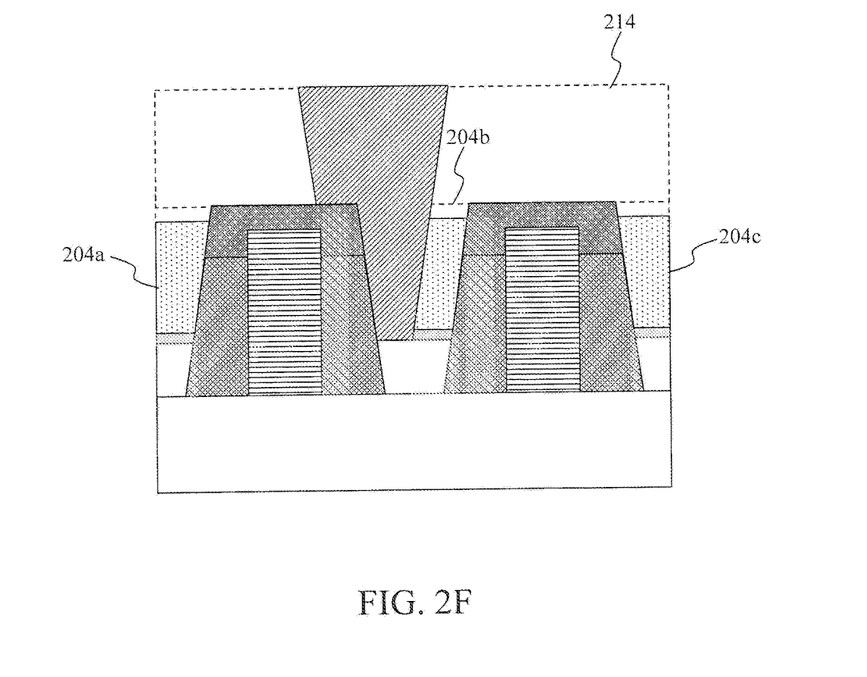

As illustrated in FIG. 2F, the exemplary method of fabrication performs a fourth patterning process on the second dielectric regions 204 and the low-κ sacrificial capping layer 214. The fourth patterning process includes an etching process, such as a dry etch or a wet etch to provide some examples, to remove some of the second dielectric regions 204 and the low-κ sacrificial capping layer 214.

Figure 2G:
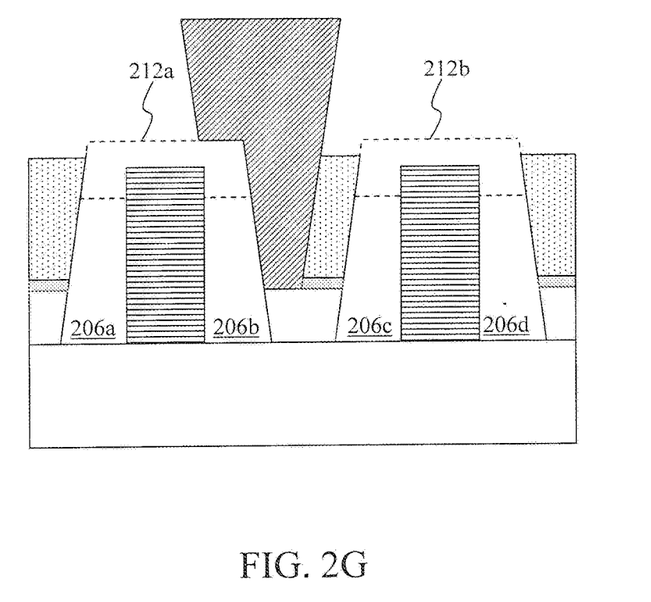

As illustrated in FIG. 2G, the exemplary method of fabrication performs a fifth patterning process on the sacrificial dielectric spacer regions 206 and the high-κ sacrificial capping regions 212. The fifth patterning process includes an etching process, such as a dry etch or a wet etch to provide some examples, to remove the sacrificial dielectric spacer regions 206 and the high-κ sacrificial capping regions 212.

Figure 2H:
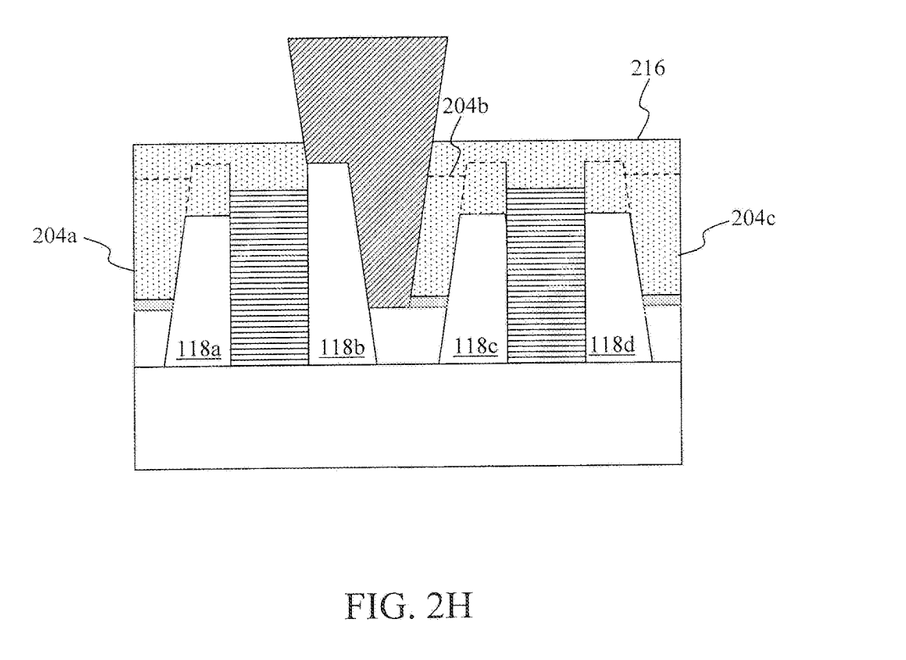

As illustrated in FIG. 2H, the exemplary method of fabrication performs an eighth deposition process to grow and/or transfer the one or more low-κ dielectric materials and/or the one or more high-κ materials on the second dielectric regions 204 to provide an air-gap capping layer 216. As a result of this deposition process, some of the one or more low-κ dielectric materials and/or the one or more high-κ materials fills in some, but not all, of the sacrificial dielectric spacer regions 206 to form the air-gap spacer regions 118. The one or more low-κ dielectric materials and/or the one or more high-κ materials are selectively chosen to solidify before filling in the sacrificial dielectric spacer regions 206 in their entirety, so that air-gap spacer regions 118 remain after the eight deposition process.

Figure 2I:
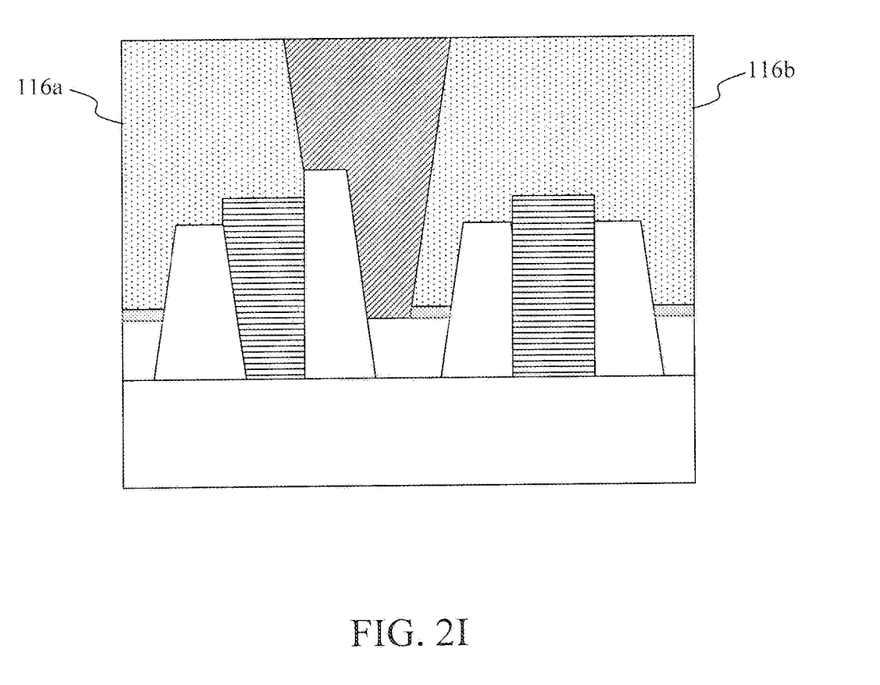

As illustrated in FIG. 2I, the exemplary method of fabrication performs a ninth deposition process to grow and/or transfer the one or more low-κ dielectric materials and/or the one or more high-κ materials on the air-gap capping layer 216 to form the second dielectric regions 116.

CONCLUSION

The following Detailed Description referred to accompanying figures to illustrate exemplary embodiments consistent with the disclosure. References in the disclosure to "an exemplary embodiment" indicates that the exemplary embodiment described include a particular feature, structure, or characteristic, but every exemplary embodiment can not necessarily include the particular feature, structure, or characteristic. Moreover, such phrases are not necessarily referring to the same exemplary embodiment. Further, any feature, structure, or characteristic described in connection with an exemplary embodiment can be included, independently or in any combination, with features, structures, or characteristics of other exemplary embodiments whether or not explicitly described.

The exemplary embodiments described within the disclosure have been provided for illustrative purposes, and are not intend to be limiting. Other exemplary embodiments are possible, and modifications can be made to the exemplary embodiments while remaining within the spirit and scope of the disclosure. The disclosure has been described with the aid of functional building blocks illustrating the implementation of specified functions and relationships thereof. The boundaries of these functional building blocks have been arbitrarily defined herein for the convenience of the description. Alternate boundaries can be defined so long as the specified functions and relationships thereof are appropriately performed.

The Detailed Description of the exemplary embodiments fully revealed the general nature of the disclosure that others can, by applying knowledge of those skilled in relevant art(s), readily modify and/or adapt for various applications such exemplary embodiments, without undue experimentation, without departing from the spirit and scope of the disclosure. Therefore, such adaptations and modifications are intended to be within the meaning and plurality of equivalents of the exemplary embodiments based on the teaching and guidance presented herein. It is to be understood that the phraseology or terminology herein is for the purpose of description and not of limitation, such that the terminology or phraseology of the present specification is to be interpreted by those skilled in relevant art(s) in light of the teachings herein.

What is claimed is:

1. An integrated circuit, comprising:
    a semiconductor substrate;
    a first transistor, having a first source/drain region, a second source/drain region, and a first gate region, situated on the semiconductor substrate;
    a second transistor, having the second source/drain region, a third source/drain region, and a second gate region, situated on the semiconductor substrate;
    an air-gap spacer region situated on the semiconductor substrate, contacting the first gate region, and extending beyond the first gate region in a vertical direction; and
    a contact region contacting the second source/drain region and overlapping the air-gap spacer region, the contact region being offset from an approximate center of the second source/drain region by a displacement distance and including a discontinuity to prevent the contact region from physically contacting the first gate region.

2. The integrated circuit of claim 1, wherein the contact region overlaps the air-gap spacer region in a horizontal direction.

3. The integrated circuit of claim 1, wherein the first gate region or the second gate region each comprises:
    a high dielectric constant (high-κ)/metal-gate (HK/MG) region.

4. The integrated circuit of claim 3, wherein the HK/MG region comprises:
    a high-κ dielectric material; and
    a conductive material situated on the high-κ dielectric material.

5. The integrated circuit of claim 1, wherein the first source/drain region, the second source/drain region, and the third source/drain region comprise:
    respective raised source/drain regions situated on the semiconductor substrate.

6. The integrated circuit of claim 1, further comprising:
    a dielectric region situated on the second source/drain region between the contact region and the second gate region.

7. The integrated circuit of claim 6, wherein the dielectric region comprises:
    a high dielectric constant (high-κ) material having a dielectric constant greater than a dielectric constant of silicon dioxide ($SiO_2$).

8. An integrated circuit situated on a semiconductor substrate, comprising:
    a transistor, having a first source/drain region, a second source/drain region, and a gate region situated on the semiconductor substrate;
    an air-gap spacer region situated on the semiconductor substrate, contacting the gate region, and extending beyond the gate region in a vertical direction; and
    a contact region, contacting the second source/drain region and overlapping the air-gap spacer region, offset from an approximate center of the second source/drain region by a displacement distance, the contact region including a discontinuity to prevent the contact region from physically contacting the gate region.

9. The integrated circuit of claim 8,
    wherein the contact region overlaps the air-gap spacer region in a horizontal direction.

10. The integrated circuit of claim 8, wherein the gate region comprises:
    a high dielectric constant (high-κ)/metal-gate (HK/MG) region.

11. The integrated circuit of claim 10, wherein the HK/MG region comprises:
    a high-κ dielectric material; and
    a conductive material situated on the high-κ dielectric material.

12. The integrated circuit of claim 8, wherein the first source/drain region and the second source/drain region comprise:
    respective raised source/drain regions situated on the semiconductor substrate.

13. The integrated circuit of claim 8, further comprising:
    a dielectric region situated on the second source/drain region between the contact region and a second gate region of a second transistor.

14. The integrated circuit of claim 13, wherein the dielectric region comprises:
    a high dielectric constant (high-κ) material having a dielectric constant greater than a dielectric constant of silicon dioxide ($SiO_2$).

15. An integrated circuit situated on a semiconductor substrate, comprising:
    a transistor, having a first source/drain region, a second source/drain region, and a gate region, situated on the semiconductor substrate;
    an air-gap spacer region situated on the semiconductor substrate, extending beyond the gate region in a vertical direction, and contacting the gate region; and
    a contact region contacting the second source/drain region and overlapping the air-gap spacer region, the contact region including a discontinuity to prevent the contact region from physically contacting the gate region.

16. The integrated circuit of claim 15, wherein the gate region comprises:
    a high dielectric constant (high-κ) dielectric material; and
    a conductive material situated on the high-κ dielectric material.

17. The integrated circuit of claim 15, further comprising:
    a dielectric region situated on the second source/drain region between the contact region and a second gate region of a second transistor.

18. The integrated circuit of claim 17, wherein the dielectric region comprises:
    a high dielectric constant (high-κ) material having a dielectric constant greater than a dielectric constant of silicon dioxide ($SiO_2$).

19. The integrated circuit of claim 17, wherein the gate region comprises:

a high dielectric constant (high-κ)/metal-gate (HK/MG) region.

20. The integrated circuit of claim 19, wherein the HK/MG region comprises:
 a high-κ dielectric material; and
 a conductive material situated on the high-κ dielectric material.

\* \* \* \* \*